United States Patent [19]
Eatwell

[11] Patent Number: 5,553,153
[45] Date of Patent: Sep. 3, 1996

[54] METHOD AND SYSTEM FOR ON-LINE SYSTEM IDENTIFICATION

[75] Inventor: Graham P. Eatwell, Cambridge, United Kingdom

[73] Assignee: Noise Cancellation Technologies, Inc., Linthicum, Md.

[21] Appl. No.: 15,195

[22] Filed: Feb. 10, 1993

[51] Int. Cl.$^6$ ................................................. A61F 11/06
[52] U.S. Cl. ............................................................ 381/71
[58] Field of Search ........................................ 381/71, 94

[56] References Cited

U.S. PATENT DOCUMENTS

| | | |
|---|---|---|
| 4,677,676 | 6/1987 | Eriksson . |
| 4,953,217 | 8/1990 | Twiney et al. ............................. 381/71 |
| 5,105,377 | 4/1992 | Ziegler, Jr. ................................ 381/71 |
| 5,278,913 | 1/1994 | Delfosse et al. .......................... 381/71 |

OTHER PUBLICATIONS

IBM J. Research and Development "Periodic Sequences with Optimal Properties for Channel Estimation and Fast Start Up Equalization" A. Milewski. pp. 426–430. Vol. 27 No. 5 Sep. 1983.

IEEE Transactions of Information Theory. "Polyphase Codes with Good Periodic Correlation Properties." David Chu. Jul. 1972 pp. 531–535.

*Adaptive Signal Processing* Bernard Widrow and Samuel Stearns. Prentice Hall, Inc. 1985, Table of Contents.

*Active Control of Sound*. Nelson and Elliot. Academic Press. 1992, Table of Contents.

*Primary Examiner*—Curtis Kuntz
*Assistant Examiner*—Ping W. Lee

[57] ABSTRACT

This invention relates to an improved method of on-line system identification for use with active control systems which requires less computation and reduces the problem of coefficient jitter in the filters of the active control system by using a fixed test signal which is designed to have a particular power spectrum.

18 Claims, 4 Drawing Sheets

METHOD AND SYSTEM FOR ON-LINE SYSTEM IDENTIFICATION

BACKGROUND

This invention relates to a technique for on-line system identification primarily for use with active control systems. A review of systems for active control of sound is given in "Active Control of Sound" by P. A. Nelson and S. J. Elliott, *Academic Press*, London. Most of the control systems used for active control are adaptive systems, wherein the controller characteristics or output is adjusted in response to measurements of the residual disturbance. If these adjustments are to improve the performance of the system, then knowledge is required of how the system will respond to any changes. This invention relates to methods for obtaining that knowledge.

Usually the system is characterized by the system impulse response, which is the time response at a particular controller input caused by an impulse at a particular output. The response therefore includes the response of the input and output processes of the system, such as actuator response, sensor response, smoothing and anti-aliasing filter responses etc. For multichannel systems, which have more than one input and/or output, a matrix of impulse responses is required, one for each input/output pair. For a sampled data representation the impulse response between the j-th output and the i-th input at the n-th sample will be denoted by $a^{ij}(n)$.

Equivalently, the system can be characterized by a matrix of transfer functions which correspond to the Fourier transforms of the impulse responses. These are defined, for the k-th frequency, by $$\overline{a}^{ij}(k) = \sum_{n=0}^{N-1} a^{ij}(n) \cdot \exp(2ikn\pi/N), \quad (1)$$

where the k-th frequency is (k/NT) Hz and T is the sampling period in seconds.

The most common technique for system identification is to send a test signal from the controller output and measure the response at the controller input. In order to discriminate against other noise in the system, a random test signal is normally used, and this is correlated with the response. Other noises which are not correlated with the test signal are rejected.

In "Adaptive Signal Processing" by B. Widrow and S. D. Stearns, *Prentice Hall*, (1985), several adaptive schemes for system identification (or plant modeling) are described.

Provided that the test signal is uncorrelated with other system noise, the system identification can continue while an active control system is in operation. In U.S. Pat. No. 4,677,676 by L. J. Eriksson this is described for a single channel active control system in a duct. This system is typical of the prior art and is summarized in FIGS. 1 and 2. FIG. 1 shows the system identification system and control system in a duct or pipe. FIG. 2 shows the equivalent block diagram. These correspond to FIGS. 19 and 20 in the original document.

It is not recognized in Eriksson that the residual signal (44 in the Figures) used to adapt the control filters is contaminated by the test signal. This will cause the system to try to adapt to cancel the test signal—resulting in a random variation or 'jitter' in the filter coefficients. This results in a reduced performance.

A further aspect of Eriksson and similar approaches is that on-line system identification is an adaptive filter and at each sampling interval every coefficient of the impulse response is updated. This is a computationally expensive operation and, since the signal processor has fixed processing power, this will slow down the maximum sampling rate of the controller and reduce its performance. Another aspect of Eriksson and similar approaches is that a random test signal (or noise source) is used.

SUMMARY OF THE INVENTION

This invention relates to an improved method and system of on-line system identification which requires less computation and removes the problem of coefficient jitter.

In contrast to the prior art, which describes the use of a random, uncorrelated test signal, the system of this invention uses a fixed test signal. The use of a fixed test signal reduces the computational requirement of the system identification. The model of the system response can be updated using an accumulated response signal or an accumulated error signal.

In another aspect of the invention, a means is provided for estimating the effect of the test signal and subtracting this from the residual (error) signal used to adapt the control system. This greatly reduces the problem of coefficient or weight jitter.

In another aspect of the invention, the system identification is performed at a rate which is different to the rate of the control filters.

Accordingly, it is an object of this invention to provide an improved method of on-line system identification which requires less computation and removes the problem of coefficient jitter.

Another object of this invention is to use a fixed test signal to reduce the number of computations required in a system identification.

A still further object of this invention is to estimate the test signal effect and subtract that from the error signal in adapting the control system.

These and other objects of this invention will become apparent when reference is had to the accompanying drawings in which FIG. 1 is a diagrammatic view of the circuitry of U.S. Pat. No. 4,677,676, FIG. 2 is a diagrammatic view of the circuitry of U.S. Pat. No. 4,677,676, FIG. 3 is a diagrammatic view of the control system of this invention incorporating on-line system identification, FIG. 4 is a diagrammatic view of the system identification circuit using accumulated response, and FIG. 5 is a diagrammatic view of the circuit using accumulated error.

DETAILED DESCRIPTION OF THE INVENTION

Figure 1:
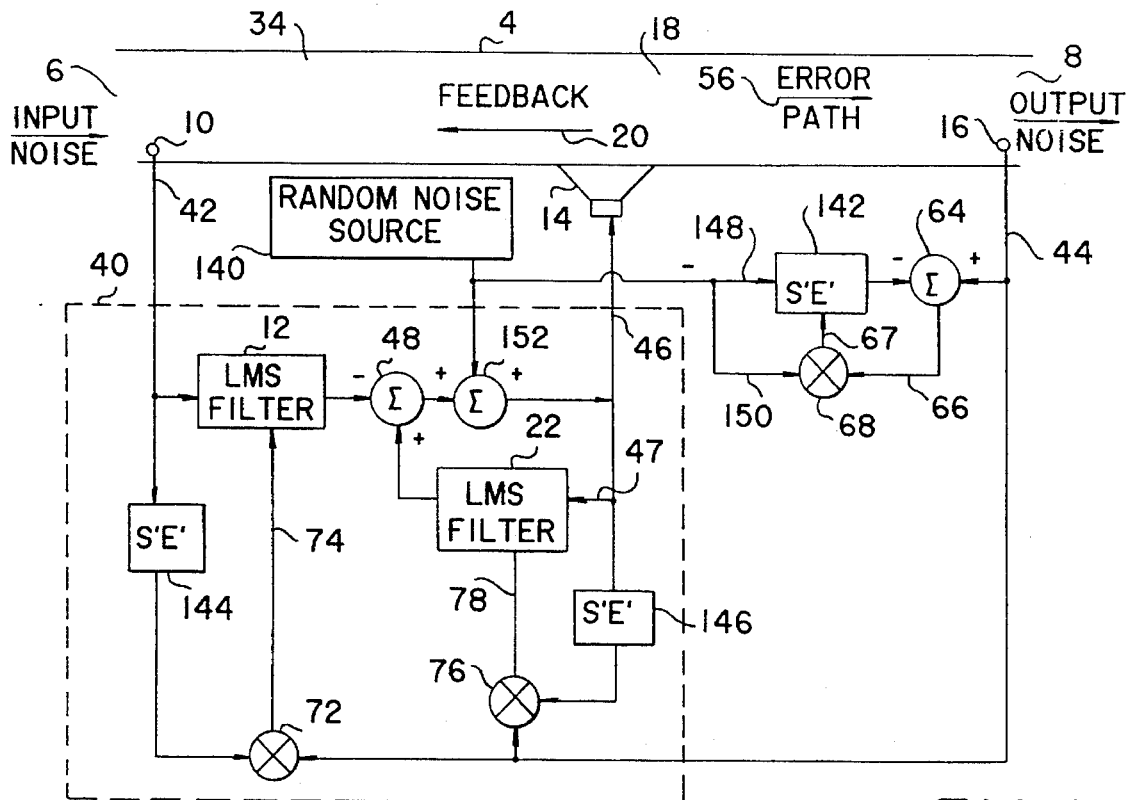
Figure 2:
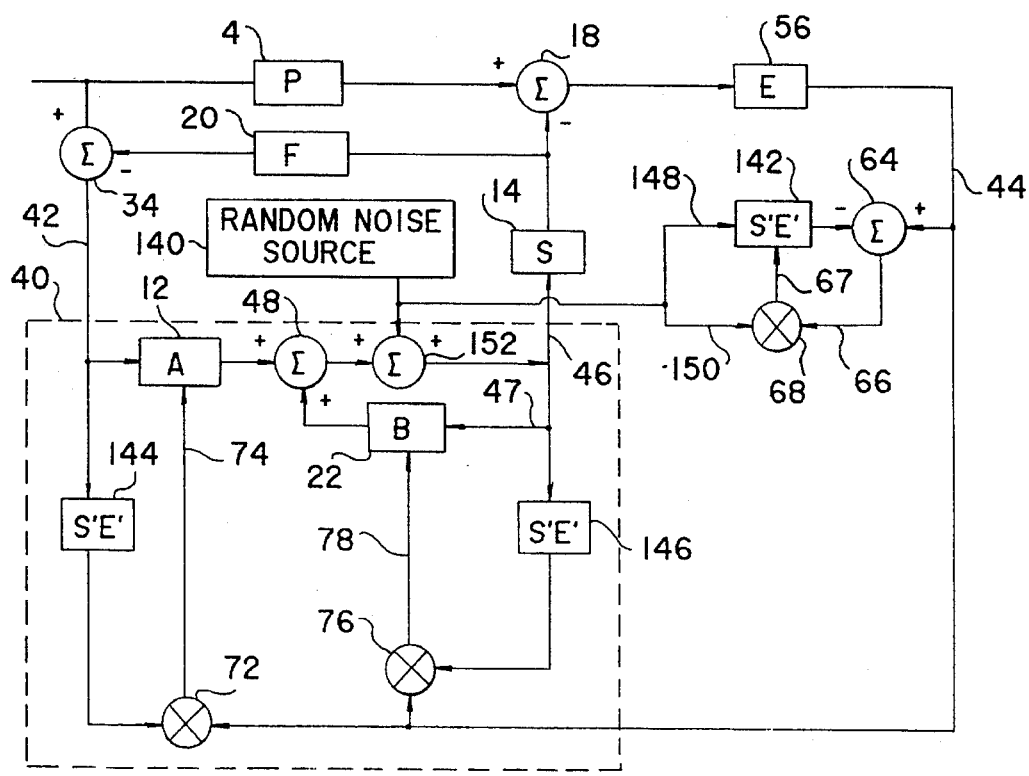

The system identification system of this invention is primarily for use with sampled data systems (either analog or digital).

The invention will be described with reference to a single channel system, although it can be easily extended to multichannel systems.

By way of explanation, we will first consider the case where the system can be modeled by a Finite Impulse Response (FIR) filter with coefficients a(n).

The response at sample n to a test signal produced from the sequence of controller outputs, y(n), is $$u(n) = \sum_{m=0}^{M-1} a(m) \cdot y(n-m) + d(n), \quad (2)$$

Where M is the number of coefficients in the filter and d(n) is the component of the response not due to the test signal, y(n). (d(n) also contains any unmodeled response.

The Least Squares estimate of the system impulse response can be obtained by correlating the response, u, with the output signal, this gives the cross-correlation $$\langle y(i)u(n)\rangle = \sum_{m=0}^{M-1} a(m) \cdot \langle y(i)y(n-m)\rangle + \langle y(i)d(n)\rangle, \quad (3)$$

where the angled brackets $\langle . \rangle$ denote the expected value. The last term can be ignored provided that the test signal is uncorrelated with the noise d(n). Equation (3) is a matrix equation for the coefficients a(m) which can be solved directly or iteratively. The LMS iterative solution is given by $$a_{i+1}(k) = a_i(k) - \mu . \langle r(n).y(n-k)\rangle + \mu . \langle u(n)y(n-k)\rangle, \quad (4)$$

where $a_i(k)$ is the estimate of the k-th term in the impulse response at the i-th iteration and where r(n) is the estimated response to the test signal given by $$r(n) = \sum_{m=0}^{M-1} a_i(m) \cdot y(n-m), \quad (5)$$

and $\mu$ is a positive convergence parameter.

In the stochastic or noisy LMS adaption algorithm the correlations are estimated over a single sample, and the angled brackets in equation (4) can be removed to give $$a_{i+1}(k) = a_i(k) - \mu.[r(n) - u(n)].y(n-k). \quad (6)$$

or, if the test signal is a random sequence with an autocorrelation which is a delta function, $$a_i+1(k) = (1-\mu).a_i(k) + \mu.u(n).y(n-k). \quad (7)$$

The algorithm in (6) is described in the "Adaptive Signal Processing" article, for example, and a similar approach is used in Eriksson's patent. At each step (i), the response r(n) must be calculated, which requires M multiplications and additions, and all M coefficients are adjusted which requires a further M multiplications and additions.

According to one aspect of the invention, a test signal is used which satisfies $$\sum_{n=0}^{M-1} y(n)y(n-m) = \begin{cases} L^2 & \text{if } m = 0 \\ 0 & \text{otherwise} \end{cases} \quad (8)$$

This condition relates to the circular autocorrelation of the test signal.

A test signal of this form is called 'block white' since a finite Fourier transform of the signal over M points will result in a flat spectrum. It is said to be 'delta-correlated' since its autocorrelation over a block of M samples, as expressed by (8), is zero except at one point. One way of constructing such a sequence is to use $$y(n) +/- 2 \cdot M^{-1/2} \cdot L \cdot \sum_{j=0}^{M/2} \epsilon_j \cos(2n j\pi/M + \phi_j) \quad (9)$$

where $\epsilon_j = \frac{1}{2}$ if j=0 or j=M/2 and $\epsilon_j = 1$ otherwise. The phase angles $\phi_j$ are zero for j=0 and j=M/2 otherwise they are arbitrary. They can be chosen to minimize the peak value of the signal, for example. Two articles describing this are "Polyphase Codes with Good Periodic Correlation Properties", by D. C. Chu, IEEE Transactions on Information Theory, July 1972, pp 531–532, and "Periodic Sequences with Optimal Properties for Channel Estimation and Fast Start-Up Equalization", by A. Milewski, IBM Journal of Research and Development, Vol. 5, No. 5, Sept. 1983, pp 426–431. Alternatively, the coefficients $\epsilon_j$ can be chosen to shape the spectrum of the test signal so as to make it less noticeable or to give a more uniform signal to noise ratio.

According to one aspect of this invention an impulsive test signal is used. This test signal is zero unless n is a multiple of M, in which case y(n)=+/−L. Here L is the level of the test signal and the sign of the signal is varied in a random or prescribed manner. This signal is obtained by setting all of the phase angles in equation (9) to zero.

In equation (2) only one value of y(n-m) is non-zero, at m=k say, so the input is $$u(n) = a(k).y(n-k) + d(n), \quad (10)$$

Figure 5:
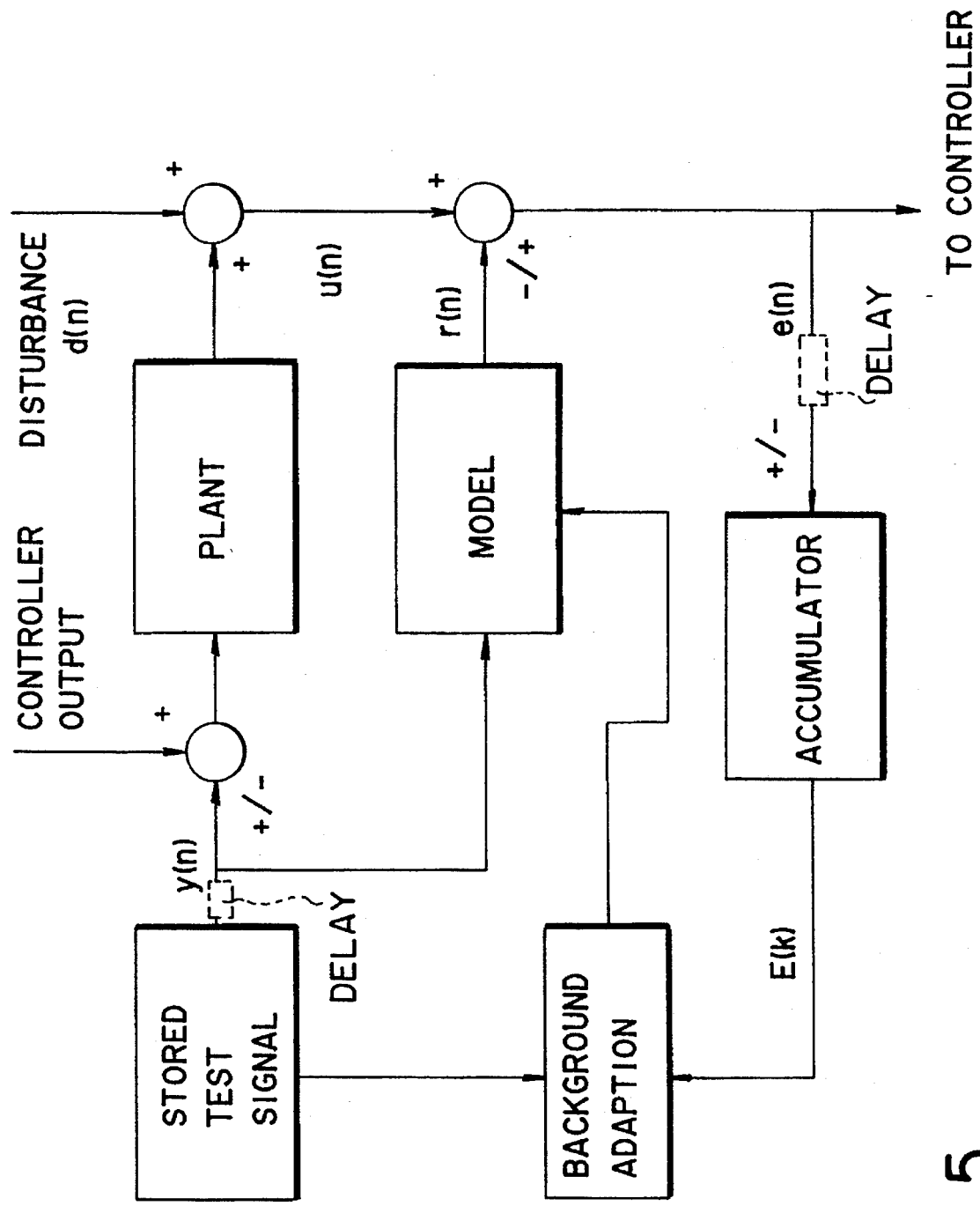

As indicated by the "+" symbol shown in FIG. 5, u(n) is always added to r(n) signal to produce e(n). The estimate of a(k) can then be adjusted using $$a_{i+1}(k) = (1-\mu)a_i(k) + \mu.u(n)/y(n-k). \quad (11)$$

or, equivalently $$a_{i+1}(k) = a_i(k) + \mu.e(n)/y(n-k). \quad (12)$$

where e(n) is the difference between the actual response and the expected response $$e(n) = u(n) - a_i(k)y(n-k). \quad (13)$$

Only one coefficient of the impulse response is being updated at each sample time. This requires 2 multiplications and additions, compared to the 2×M multiplications and additions of previous methods.

The update can be performed in every sample interval if required. Alternatively, the update can be performed at a slower rate. The update can be done as a background task, where the update rate is determined by the processing power of the system identification circuit shown in FIG. 4.

Figure 3:
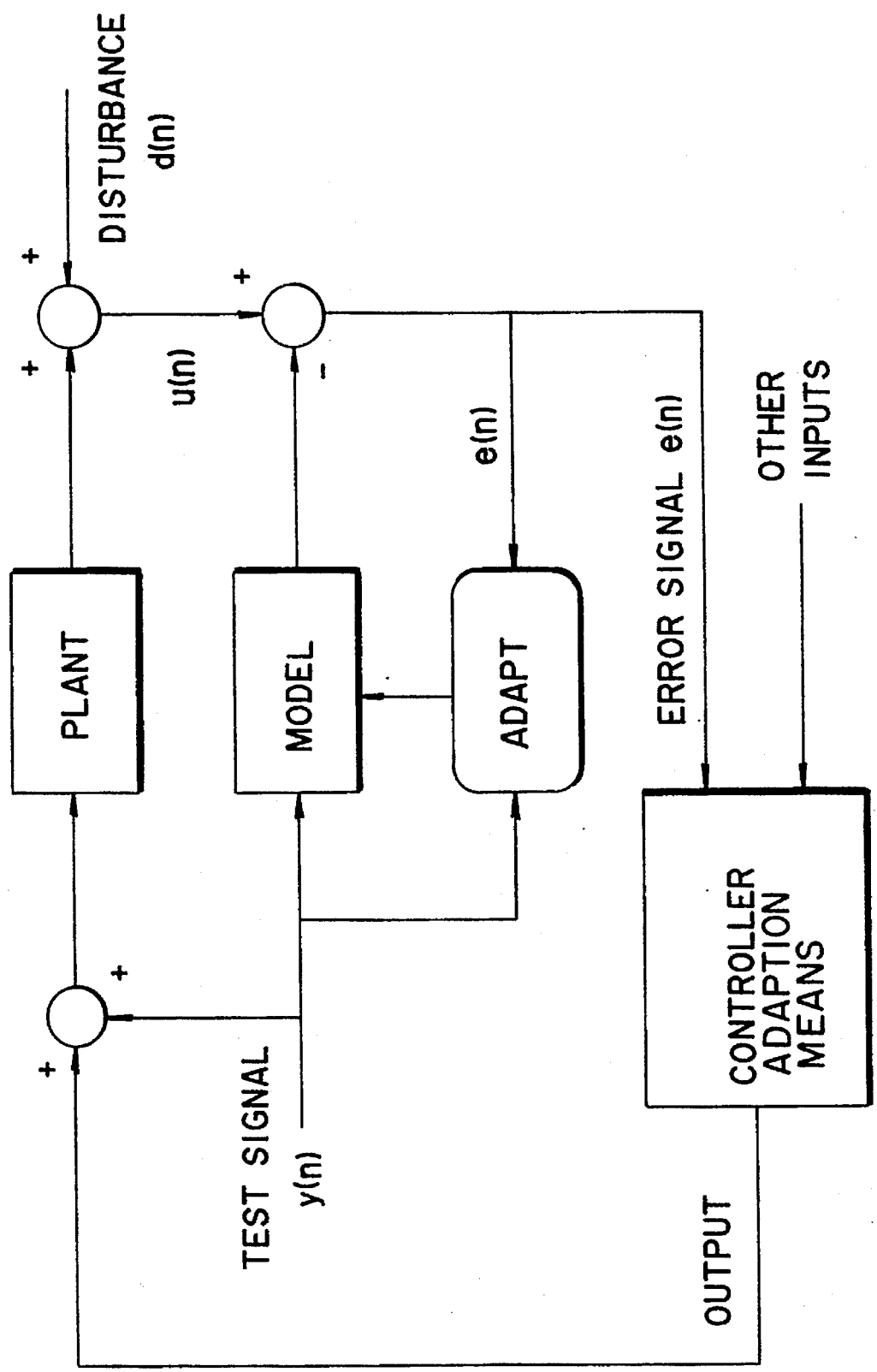

One embodiment of the system described by equations (12) and (13) and incorporated into an active control system, is shown in FIG. 3. In contrast to the prior art, the signal e(n) is used to adapt the control system rather then the signal u(n). This reduces the problem of weight jitter.

Alternatively, the system can be estimated using the general block white signal. This same signal is sent out repeatedly, except that the sign is changed in some random or predetermined manner in order to decorrelate the test signal with any other signals. Additionally, or alternatively, the test signal can be delayed by varying amounts to aid decorrelation. Preferably, this delay is a whole number of sample periods. It can be achieved either by varying the number of samples (the gap) between each block of measurements, or by starting the test signal from a different point within the block. Account is taken of this delay when the response to the signal is accumulated.

If the sign of the test signal is changed, then two blocks of the signal are sent out with the same sign, and measurements are only made in the second block. This ensures that real convolutions can be replaced by circular convolutions and so use can be made of the property in equation (8).

Limiting the length of the block to exactly M points, so that it has the same length as the model filter, means that a maximum amount of time is spent measuring (which makes adaption to changes quicker) and a minimum of storage is required.

Figure 4:
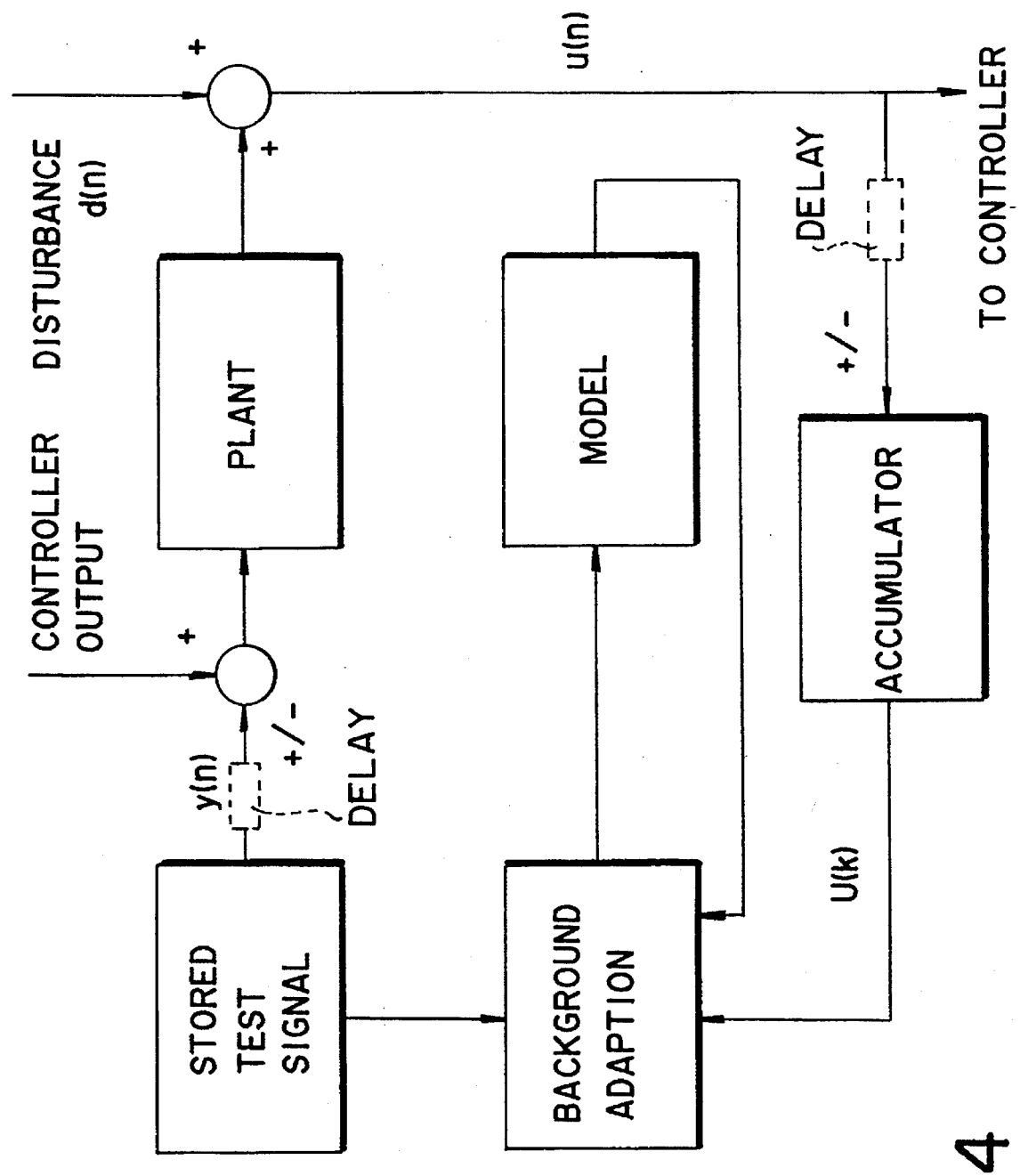

The response at the controller input is accumulated, with the appropriate sign and/or delay, and then used to adapt the model of the system. One embodiment of this approach is shown in FIG. 4 and will now be described in more detail. Variable delay is not used in this example.

We define a number $s_j$ which is 0 if the sign has changed from one block to the next and otherwise is equal to +/−1 depending on the sign of the j-th block. We denote the accumulated response at the n-th point in the block by U(n). We denote by $u_j(n)$ the value of the input at the n-th point in the j-th block. U(n) can be accumulated over N consecutive blocks of M samples. Using equation (2) this gives $$U(n) = \sum_{j=0}^{N-1} s_j \cdot u_j(n) \qquad (14)$$
$$= \sum_{n=0}^{N-1} \sum_{m=0}^{M-1} a(m) \cdot s_j y_j(n-m) + \sum_{j=0}^{N-1} s_j \cdot d_j(n),$$
$$= N' \sum_{m=0}^{M-1} a(m) \cdot y(n-m),$$

where $$N' = \sum_{j=0}^{N-1} |s_j|$$

is the number of non-zero accumulations made and y(n) is the fixed test sequence.

There are two ways in which the accumulated response U(n) can be used to calculate the coefficients a(m). The first way is to correlate U with the test signal. This gives $$\sum_{n=0}^{M-1} U(n) \cdot y(n-k) = N' \sum_{n=0}^{M-1} \sum_{m=0}^{M-1} a(m) \cdot y(n-m) \cdot y(n-k) = N'L^2 a(k)$$

and so the coefficients can be updated using $$a_{i+1}(k)=(1-\mu)a_i(k)+\mu a'(k). \qquad (16)$$

where $$a'(k) = (1/N'L^2) \sum_{n=0}^{M-1} U(n) \cdot y(n-k). \qquad (17)$$

The correlation and update can be done in the processor as a background task or by a separate processor.

The level, L, of the test signal can be chosen with reference to the power in the residual signal, or the power in the cancellation signal and/or the response of the system. Additionally, or alternatively, it can be chosen with reference to quantization errors in the digital system.

The other way of calculating a(k) is via a Discrete Fourier transform of the accumulated values U(n) as shown in FIG. 4. This approach can also be used even when the coefficients of the test sequence, $\epsilon_j$ in equation (9), are not chosen to give a flat spectrum.

The Fourier transform of (14) gives $$\overline{U}(k)=N'\overline{\alpha}(k).\overline{y}(k), \qquad (18)$$

from which $$\overline{\alpha}_{i+1}(k)=(1-\mu)\overline{\alpha}_i(k)+(\mu/N') \cdot \overline{U}(k)/\overline{y}(k). \qquad (19)$$

The coefficients a(n) can be found from an inverse transform of (19), or the Fourier coefficients can be used directly.

The amplitudes $\epsilon_j$ can be chosen so that the power spectrum of the response to the test signal and the power spectrum of the residual noise have a fixed ratio. For example, with L=1, $$[\epsilon_k]^2 = \lambda \cdot |\overline{r}(k)|^2 / |\overline{\alpha}(k)|^2 + \min(k) \qquad (20)$$

where $\lambda$ is a positive factor and min(k) is a low-level spectrum which can be included to ensure that the test signal is not zero in any frequency band and that any quantization errors in the digital system do not have too large an effect.

The estimates of the modulus of the residual signal $\overline{r}(k)$ can be obtained recursively to cope with changing signal statistics.

Alternatively, the coefficients $\epsilon_j$ can be chosen so that the response to the test signal is white, but the power level, L, can be chosen to be proportional to the power in the residual signal. Alternatively, the coefficients can be chosen to give any other desired frequency spectrum.

The averaging process used in the above techniques allows for small test signals to be used, which reduces the effects of weight jitter in the cancellation filters.

In an alternative approach, the effect of the test signal is subtracted from the response signal.

This new signal is used for the adaption of the cancellation filters and is accumulated for use in the adaption of the system model. One embodiment of this approach is shown in FIG. 5.

For the adaption of the model, the difference between the expected response and the actual response is accumulated. This gives an accumulated error defined by $$E(n) = \sum_{j=0}^{N-1} s_j \cdot e_j(n) \qquad (21)$$

where $$e_j(n)=u_j(n)-r_j(n) \qquad (22)$$

is the 'corrected' error signal at the n-th point in the j-th block and is used for the adaption. The accumulated error signal is related to the difference between the actual impulse response and the current estimate, since $$E(n) = \sum_{n=0}^{N-1} \sum_{m=0}^{M-1} [a(m) - a_i(m)] \cdot s_j y_j(n-m) + \sum_{j=0}^{N-1} s_j \cdot d_j(n), \qquad (23)$$
$$= N' \sum_{m=0}^{M-1} [a(m) - a_i(m)] \cdot y(n-m),$$

where $a_i(m)$ is the current estimate of the impulse response, which is used to calculate r(m).

Correlating the accumulated error E(n) with the test signal gives $$\sum_{n=0}^{M-1} E(n) \cdot y(n-k) = N'L^2 [a(k) - a_i(k)] \qquad (24)$$

and the update equation for the impulse response is $$a_{i+1}(k) = a_i(k) + (\mu/N'L^2) \cdot \sum_{n=0}^{M-1} E(n) \cdot y(n-k) \quad (25)$$

where $0<\mu<2$ and $\mu$ is chosen with reference to the ratio of the test signal level to the noise level.

The corresponding frequency domain update is $$\overline{\alpha}_{i+1}(k) = \overline{\alpha}_i(k) + (\mu/N') . \overline{E}(k) \overline{y}_0(k) \quad (26)$$

This update is performed only once every N blocks of M points, and so for N>1 it represents a considerable saving over the previous methods. The update can be performed as a background task.

The signal e(n) is used to update the coefficients of the control filter. This is in contrast to previous methods which use the signal u(n) and so try to adapt to cancel the test signal.

Some physical systems are more efficiently modeled as recursive filters rather than FIR filters. The response at the input is then modeled by $$u(n) = \sum_{m=0}^{M-1} a(m) \cdot y(n-m) + \sum_{p=0}^{P-1} b(p) \cdot r(n-p) + d(n), \quad (27)$$

where b(p) are the coefficients of the feedback filter and r(n) is given by equation (5). The total number of computations involved in calculating the estimated response to the test signal can often be reduced by using this type of filter.

The techniques for adapting this type of filter are well known (see "Adaptive Signal Processing", Widrow and Stearns, for example). These techniques can easily be modified to use test signals of the type described above.

Having described the invention it will be obvious to those of ordinary skill in the art that many modifications and changes can be made without departing from the scope of the appended claims in which

I claim:

1. An active noise or vibration control system with on-line system identification for identifying the response of a physical system, said control system comprising control means producing control signals, said control means including control adaption means responsive to residual signals, test signal generating means for generating test signals, wherein the test signal generating means includes means for delaying or inverting a fixed test signal of length determined by the response time of the physical system, including actuator means and sensing means, said actuation means responsive to a combination of the control signals and the test signals and producing a canceling noise or vibration, one component of which counters or partially counters an unwanted first noise or vibration, said sensing means responsive to the combination of said canceling noise or vibration and said first noise or vibration and producing input signals, compensation filter means responsive to said test signals and producing compensation signals, said compensation filter means including a filter adaption means responsive to said test signals and said residual signals and configured to minimize the correlation between the residual signals and the test signals, signal subtraction means for subtracting said compensation signals from said input signals to produce said residual signals, characterized in that the compensation signals substantially cancel the components of the input signal due to the test signals.

2. An active noise or vibration control system as in claim 1 and including means for delaying the residual signals by the same amount as the test signals and inverting the residual signals whenever the test signals the inverted so as to produce delayed or inverted residual signals.

3. An active noise or vibration control system as in claim 2, said control system including accumulation means for accumulating said delayed or inverted residual signals so as to produce accumulated residual signals.

4. An active noise or vibration control system as in claim 3 wherein the compensation filter means is adapted in response to said accumulated residual signals and said fixed test signal.

5. An active noise or vibration control system as in claim 4 wherein the compensation filter means is adapted in response to the product of said accumulated residual signals and said fixed test signal.

6. An active noise or vibration control system as in claim 1 and including means for delaying the input signals by the same amount as the test signals and inverting the input signals whenever the test signals are inverted so as to produce delayed or inverted input signals.

7. An active noise or vibration control system as in claim 6, said control system including accumulation means for accumulating said delayed or inverted input signal so as to produce accumulated input signal.

8. An active noise or vibration control system as in claim 7 wherein predicted responses to said fixed test signal are produced by passing said test signals through said compensation filter means and wherein the compensation filter means is adapted in response to said accumulated input signals and the predicted responses.

9. An active noise or vibration control system as in claim 8 wherein the compensation filter means is adapted in response to a Fourier Transform of said accumulated input signals and a Fourier transform of said test signals.

10. An active noise or vibration control system as in claim 8 wherein the compensation filter means is adapted in response to said accumulated input signals, said fixed test signal and said predicted responses.

11. An active noise or vibration control system as in claim 1 wherein said fixed test signal, y(n) at time sample n, satisfies $$\sum_{n=0}^{M-1} y(n)y(n-m) = \begin{cases} L^2 & \text{if } m=0 \\ 0 & \text{otherwise} \end{cases}$$

wherein M is the length of said fixed test signal and L is a constant.

12. An active noise or vibration control system as in claim 1 wherein said fixed test signal, y(n) satisfies y(0)=L y(n)=0, n=1,2,3, ... , M−1 where M is the length of said fixed test signal and L is a constant.

13. An active noise or vibration control system as in claim 1 wherein one compensation filter means is used to couple each actuator output with each sensor input.

14. An active noise or vibration control system as in claim 1 wherein said compensation filter means is a Finite Impulse Response filter.

15. An active noise or vibration control system as in claim 1 wherein said compensation filter means is an Infinite Impulse Response or recursive filter.

16. An active noise or Vibration control system as in claim 1 wherein said compensation filter means is a Lattice filter.

17. An active noise or vibration control system as in claim 1 wherein said compensation filter means is adapted less frequently than said control means.

18. An active noise or vibration control system as in claim 1 wherein the control adaption means and the compensation filter adaption means operate at a different rate to the control means and the adaption rate of said compensation filter means is determined by the processing power of said active noise control system.

* * * * *